US012255033B2

(12) United States Patent
Chen et al.

(10) Patent No.: US 12,255,033 B2
(45) Date of Patent: Mar. 18, 2025

(54) METHOD FOR MONITORING CIRCUIT BREAKER AND APPARATUS AND INTERNET OF THINGS USING THE SAME

(71) Applicant: ABB Schweiz AG, Baden (CH)

(72) Inventors: Niya Chen, Beijing (CN); Xin Zhang, Xiamen (FJ); Jiayang Ruan, Beijing (CN); Rongrong Yu, Beijing (CN)

(73) Assignee: ABB Schweiz AG, Baden (CH)

( * ) Notice: Subject to any disclaimer, the term of this patent is extended or adjusted under 35 U.S.C. 154(b) by 720 days.

(21) Appl. No.: 16/521,976

(22) Filed: Jul. 25, 2019

(65) Prior Publication Data

US 2019/0348243 A1 Nov. 14, 2019

Related U.S. Application Data (63) Continuation of application No. PCT/CN2017/088974, filed on Jun. 19, 2017.

(51) Int. Cl.
*H01H 71/04* (2006.01)
*G01R 31/327* (2006.01)

(52) U.S. Cl.
CPC ........... *H01H 71/04* (2013.01); *G01R 31/327* (2013.01); *G01R 31/3274* (2013.01); *G01R 31/3275* (2013.01); *H01H 2071/044* (2013.01)

(58) Field of Classification Search
CPC ............. H01H 71/04; H01H 2071/044; G01R 31/3274; G01R 31/3275; G01R 31/327; G01R 31/3272
See application file for complete search history.

(56) References Cited

U.S. PATENT DOCUMENTS 6,170,316 B1 * 1/2001 Aldrich .............. G01R 31/3277
  73/1.68
7,141,963 B1 * 11/2006 Rankin, II ......... G01R 31/3277
  324/142

(Continued)

FOREIGN PATENT DOCUMENTS

CN 1645534 A 7/2005
CN 202066680 12/2011

(Continued)

OTHER PUBLICATIONS

European Patent Office, Extended Search Report issued in corresponding Application No. 17914447.2, mailed Nov. 30, 2020, 10 pp.

(Continued)

*Primary Examiner* — Steven L Yeninas
(74) *Attorney, Agent, or Firm* — Greenberg Traurig, LLP (57) ABSTRACT

A method for monitoring a circuit breaker and an apparatus and an internet of things using the same. The method includes: obtaining a first data set representing force applied to a fixed point of an element of an actuating mechanism of the circuit breaker in present operation cycle, judging a health condition of the circuit breaker in consideration of normal operating condition related parameters of the element according to a history profile when the circuit breaker operated normally and current operating condition related parameters of the element in the present operation cycle extracted from the force represented by the first data set, and generating a signal indicating the health condition of the actuating mechanism of the circuit breaker. The force applied to the fixed point of the actuating mechanism of the circuit breaker, which corresponds to a health condition of mechanical parts of the circuit breaker as a whole, is selected as an indicator for condition monitoring of the mechanical parts of the circuit breaker. The operating condition related parameters derived from the measurements of the force are (Continued)

considered giving a relatively high accurate judgement of the whole mechanical parts of the circuit breaker.

11 Claims, 6 Drawing Sheets

(56) References Cited

U.S. PATENT DOCUMENTS

| | | | |
|---|---|---|---|
| 9,071,190 | B2 | 6/2015 | Girlando et al. |
| 9,279,858 | B2 * | 3/2016 | Min .................... H02B 13/065 |
| 2002/0035416 | A1 * | 3/2002 | De Leon ................ G07C 5/008 |
| | | | 701/32.4 |
| 2014/0069195 | A1 | 3/2014 | Ledbetter |
| 2016/0141117 | A1 * | 5/2016 | Ashtekar .................. H02H 3/04 |
| | | | 324/424 |
| 2016/0299192 | A1 | 10/2016 | Zhuang et al. |
| 2017/0045481 | A1 * | 2/2017 | Benke .................... G01N 29/46 |
| 2017/0047174 | A1 * | 2/2017 | Chen ........................ H01H 3/38 |
| 2017/0047186 | A1 * | 2/2017 | Chen .................. G01R 31/3271 |
| 2017/0194113 | A1 * | 7/2017 | Yang .................. G01R 31/3277 |
| 2017/0250047 | A1 * | 8/2017 | Zhuang .............. H01H 71/0264 |

FOREIGN PATENT DOCUMENTS

| | | |
|---|---|---|
| CN | 102509178 A | 6/2012 |
| CN | 102721919 A | 10/2012 |
| CN | 102893361 A | 1/2013 |
| CN | 103323771 A | 9/2013 |
| CN | 104198929 A | 12/2014 |
| CN | 105158685 A | 12/2015 |
| CN | 105324900 A | 2/2016 |
| CN | 105606997 A | 5/2016 |
| CN | 105628419 A | 6/2016 |
| CN | 105629100 A | 6/2016 |
| CN | 105629164 A | 6/2016 |
| CN | 105973621 A | 9/2016 |
| CN | 106092556 A | 11/2016 |
| CN | 106093771 A | 11/2016 |
| CN | 106291344 A | 1/2017 |
| CN | 106461725 A | 2/2017 |
| EP | 2685575 A2 | 1/2014 |
| WO | 2016049825 A1 | 4/2016 |
| WO | WO 2016/049825 * | 4/2016 ........... G01R 31/327 |
| WO | 2016-074171 A1 | 5/2016 |
| WO | WO 2016/074171 * | 5/2016 ........... G01R 21/327 |

OTHER PUBLICATIONS

Chinese Patent Office, Office Action issued in corresponding Application No. 2017800839441, mailed Feb. 2, 2021, 21 pp.

Andrusca et al., "Embedded System and Software Application for Monitoring and Diagnosis of High Voltage Circuit Breakers," 2012 International Conference and Exposition on Electrical and Power Engineering, Oct. 25-27, 2012, Iasi, Romania, pp. 159-166.

Feizifar et al., "Condition Monitoring of Circuit Breakers: Current Status and Future Trends," 2017 IEEE International Conference on Environment and Electrical Engineering and 2017 IEEE Industrial and Commercial Power Systems Europe, Jun. 6, 2017, 5 pp.

Hu et al., "Assessment Method for Break State of Circuit Breaker Based on Force Monitoring of Contact," High Voltage Apparatus, vol. 51, No. 9, Sep. 16, 2015, pp. 116-122.

State Intellectual Property Office of the P.R. China, International Search Report & Written Opinion issued in corresponding Application No. PCT/CN2017/088974, mailed Mar. 21, 2018, 10 pp.

Hu et al., "Assessment Method for Break State of Circuit Breaker Based on Force Monitoring of Contact," High Voltage Apparatus, Vo. 51, No. 9, Sep. 16, 2015, pp. 0116-0122, Abstract in English.

China—Decision to Refuse, issued by the China National Intellectual Property Administration, regarding corresponding patent application Serial No. CN201780083944.1; dated Jan. 28, 2022; 20 pages (with English translation).

Tang, Jianzhong et al.; "Contact Force Monitoring and Its Application in Vacuum Circuit Breakers", IEEE Transactions on Power Delivery; vol. 32, No. 5, Oct. 2017; IEEE Service Center, New York, pp. 2154-2161.

* cited by examiner

METHOD FOR MONITORING CIRCUIT BREAKER AND APPARATUS AND INTERNET OF THINGS USING THE SAME

TECHNICAL FIELD

The invention relates to the field of circuit breaker, and more particularly to monitoring health condition of circuit breaker.

BACKGROUND ART

Circuit breaker is one of the most critical components of a substation, whose safety and reliability are of high importance to the overall power grid. The market of smart circuit breaker is increasing rapidly these years, especially with the world's growing attention on digital products. Therefore, it's desired by the market a kind of smart circuit breaker being able to real-time monitor its defects and severity thereof before evolving to real failure, namely to monitor its health condition before real failure occurring.

Circuit breaker defect monitoring is known in the prior art as shown in Patent CN 105629164 A. In the above referenced patent, health condition of an energy storage spring of a circuit breaker is on-line monitored by observing tension and pressure applied to the spring and its ambient temperature. The heath condition of the spring is determined based on measurements of those operating condition related parameters and applying simple threshold comparison.

In the prior art, the threshold is applied for assessing the health condition of particular element of the circuit breaker, such as the spring. This suffices the purpose of monitoring health condition of the particular element only. Because of the threshold's peculiarity indicating the defects of spring, it is generally impractical to use such threshold for judging a health condition of an actuating mechanism of the circuit breaker, which generally includes but not limited to a linkage mechanism, an energy storage spring, and so on.

BRIEF SUMMARY OF THE INVENTION

According to an aspect of present invention, it provides a method for monitoring a circuit breaker, including: obtaining a first data set representing force applied to a fixed point of an element of an actuating mechanism of the circuit breaker in present operation cycle, judging a health condition of the circuit breaker in consideration of normal operating condition related parameters of the element according to a history profile when the circuit breaker operated normally and current operating condition related parameters of the element in the present operation cycle extracted from the force represented by the first data set, and generating a signal indicating the health condition of the actuating mechanism of the circuit breaker the circuit breaker.

According to another aspect of present invention, it provides an apparatus for monitoring a circuit breaker, including: a force sensor, being configured to measure a force applied to a fixed point of an element of an actuating mechanism of the circuit breaker in present operation cycle and generate a first data set representing the measurement of the force in the present operation cycle; and a microprocessor, being configured to judge a health condition of the circuit breaker in consideration of normal operating condition related parameters of the element according to a history profile when the circuit breaker operated normally and current operating condition related parameters of the element in the present operation cycle extracted from the force represented by the first data set, and being configured to generate a signal indicating the health condition of the actuating mechanism of the circuit breaker.

According to another aspect of present invention, it provides an internet of things, including: a circuit breaker, the apparatus for monitoring a circuit breaker, and a server having the microprocessor of the apparatus for monitoring the circuit breaker.

By having the solutions according to present invention, the force applied to the fixed point of the actuating mechanism of the circuit breaker, which corresponds to a health condition of mechanical parts of the circuit breaker as a whole, is selected as an indicator for condition monitoring of the mechanical parts of the circuit breaker. The operating condition related parameters derived from the measurements of the force are considered giving a relatively high accurate judgement of the whole mechanical parts of the circuit breaker.

A technical effect of the circuit breaker monitoring apparatus and methods described herein featured in terms of high accuracy because of using force sensor and proper time-frequency analysis method, high intelligence due to automatic model developing based on data-driven solutions.

Preferably the operating condition related parameters of the element concern with at least one of: opening/closing speed of a movable contact of the circuit breaker, total travel of the movable contact, timing of the opening/closing, travel of the movable contact, and over travel of the movable contact.

Preferably, a second data set representing force applied to the fixed point in a plurality of operation cycles may be obtained from the history profile, and the normal operating condition related parameters for each of the operation cycles may be extracted from the force represented by the second data set.

Preferably, the extraction of the operating condition related parameters is adapted to low-frequency extraction.

Preferably, the second data set is divided into two groups respectively corresponding to a first number and a second number of the plurality of operation cycles from the history profile, in terms of the operating condition related parameter, identifying historical dissimilarity involving the respective one of the second number of the operation cycles and the first number of the operation cycles, in terms of the operating condition related parameter, identifying current dissimilarity involving the current operation cycle and the first number of the operation cycles, and the judgement of the health condition of the circuit breaker is based on a comparison of the historical dissimilarity and the current dissimilarity. During each operation cycle, the force measured at a fixed point of the actuating mechanism models the health condition of the circuit breaker, which varies from normal condition to defective condition of the actuating mechanism. By measuring and analysing the force during each operation cycle, a health condition of the actuating mechanism, which corresponds to a dissimilarity between current condition and historical healthy condition in terms of the operating condition related parameters, may be determined.

Preferably, the operation cycle covers a period when the circuit breaker starts from closing to opening or vice versa.

Preferably, the element is of a linkage mechanism having the fixed point as one of its fulcrums, or the element is of a spring.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

Figure 1:
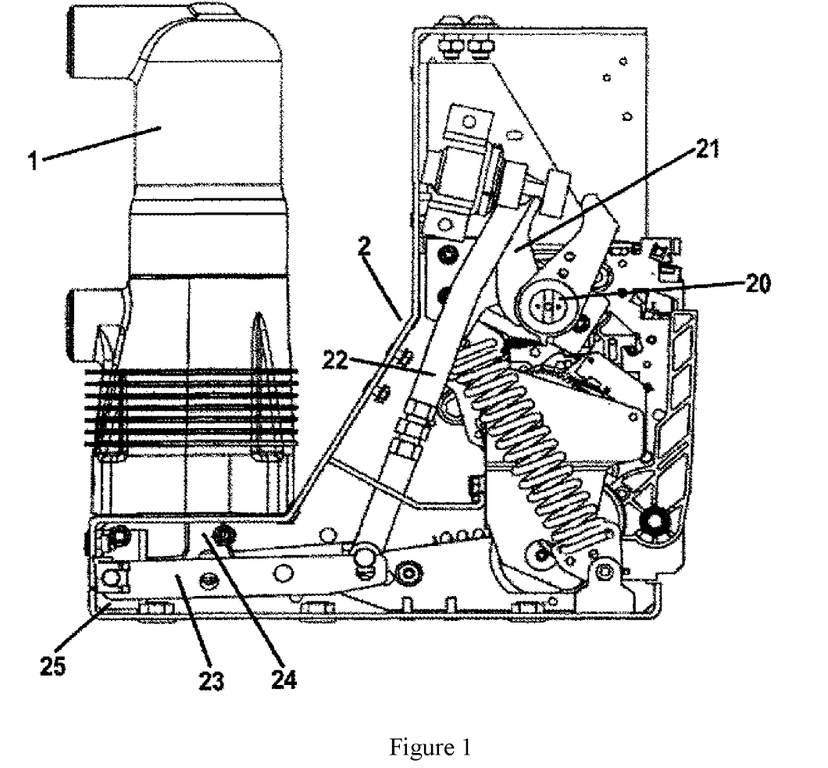
FIG. 1 illustrates an exemplary circuit breaker which can be on-line monitored by the method according to an embodiment of the present invention.

FIG. 1 illustrates an exemplary circuit breaker which can be on-line monitored by the method according to an embodiment of the present invention. The circuit breaker as shown in FIG. 1 is a vacuum circuit breaker, comprising a stationary contact and a movable contact (not shown) enclosed in an insulation pole 1, and an actuating mechanism 2 for actuating the closing and opening action of the movable contact. The actuating mechanism 2 has a plurality of elements including a linkage mechanism and a spring. The linkage mechanism is for transmitting a driving force from an active element for example, a motor or the spring actuator, to the movable contact. As shown in FIG. 1, for example, the linkage mechanism may be a four-bar linage which comprises a first lever 21, a second level 22, a third lever 23 pivotally connected to each other in sequence. The first lever 21 is connected to a driving shaft 20 driven by an active element, and the third lever 23 is pivotally connected to a fixed point 25 on the base of the circuit breaker. For example, the fixed point 25 may be one of the fulcrums of the linkage mechanism. A push rod 24 on one end is pivotally connected to the movable contact at a distance from the pivot point between the third level 23 and the fixed point 25. The other end of the push rod 24 is connected to the movable contact in the insulation pole 1. By driving the driving shaft 20 rotating via the motor or the spring, the movable contact can be moved up and down in a longitudinal direction in the pole 1 by the force transmission from the first lever 21, the second level 22, the third lever 23 and the push rod 24, so as to contact or be separated from the stationary contact and thus close or open the circuit.

Figure 2:
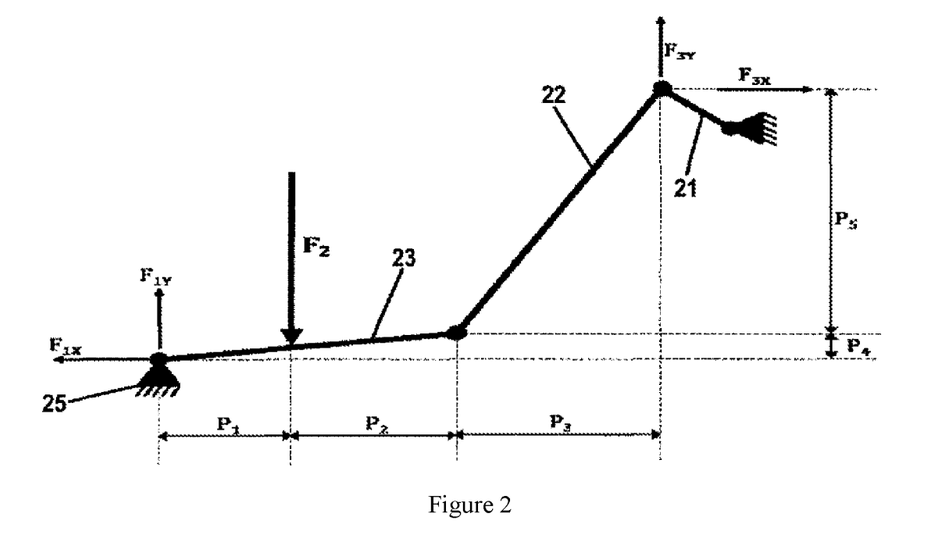
FIG. 2 illustrates the force applied on the linkage mechanism of the circuit breaker as shown in FIG. 1.

FIG. 2 illustrates the force applied on the linkage mechanism of the circuit breaker as shown in FIG. 1. In a balanced closed state of the circuit breaker, the movable contact abuts against the stationary contact under a force from the linkage mechanism. In this case, the stationary contact would apply a counter force F2 (also referred to as contact force) on the movable contact which is in turn conducted to the third lever 23 through the push rod 24. Once the movable contact is separated from the stationary contact in the opening period, the counter force F2 on the movable contact, the push rod 24 and the third lever 23 would decrease dramatically and even become zero. Likewise, during the closing period of the circuit breaker, the counter force F2 applied on the movable contact by the stationary contact would dramatically from zero to a relative high value.

Figure 3A:
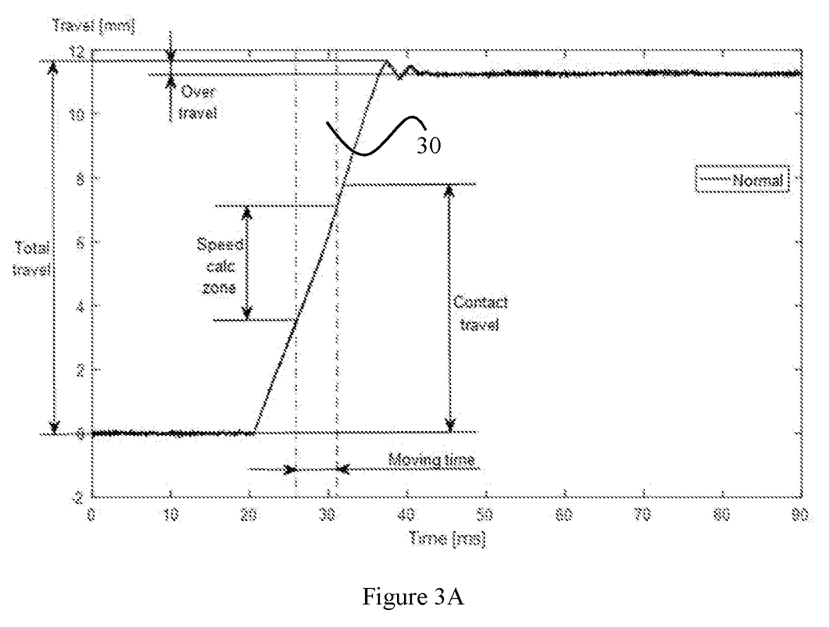
FIG. 3A and FIG. 3B are graphs of an exemplary travel curves of a circuit breaker respectively in normal condition and defective condition for an opening operation.
Figure 3B:
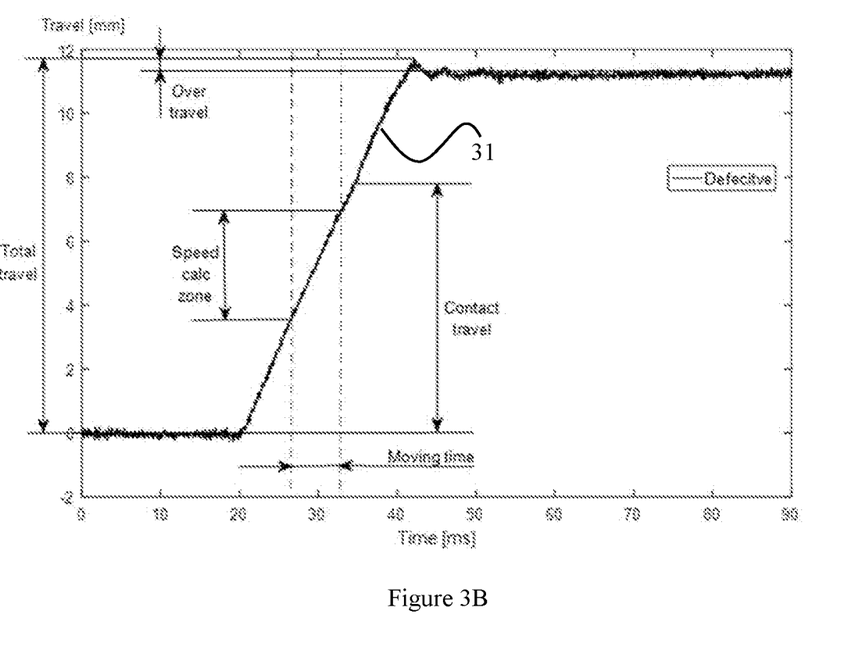
Figure 3C:
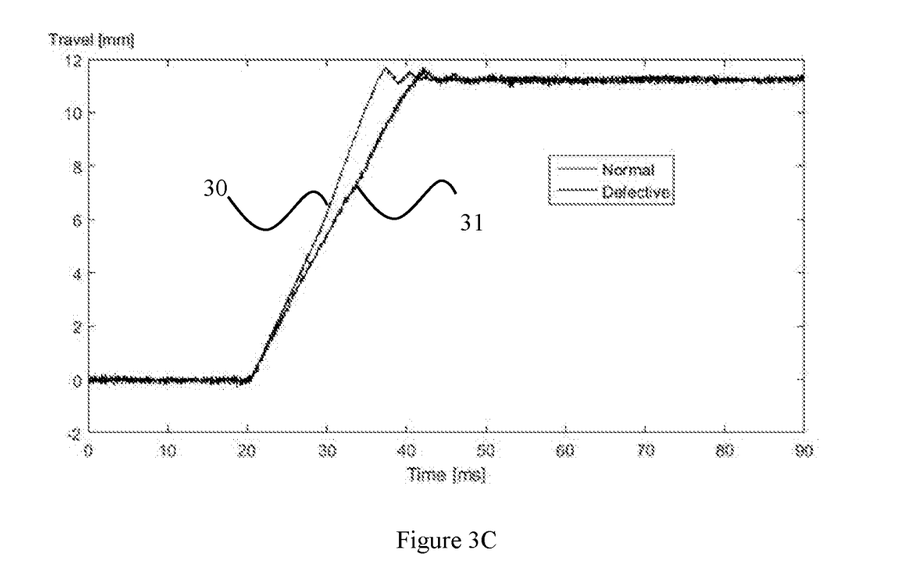
FIG. 3C illustrates a comparison of the travel curves from FIG. 3A and FIG. 3B.

FIG. 3A and FIG. 3B are graphs of an exemplary travel curves of a circuit breaker respectively in normal condition and defective condition for an opening operation. FIG. 3C illustrates a comparison of the travel curves from FIG. 3A and FIG. 3B. A circuit breaker having the defect can still operate but will eventually develop into a failure. A defect stage occurs between normal stage and failure stage. The graph of FIG. 3A, FIG. 3B and FIG. 3C include an x-axis indicative of time and a y-axis illustrating travel at each corresponding unit of time, and the travel curve 30 presents the normal operation and the travel curve 31 presents the defective operation. A group of operating conditions covers the circuit breaker timing. Timing is explained in FIG. 3A, FIG. 3B and FIG. 3C for the opening operation. The operating conditions include at least one of: opening/closing speed of a movable contact of the circuit breaker, total travel of the movable contact, timing of the opening/closing, travel of the movable contact, and over travel of the movable contact. The opening/closing speed of a movable contact of the circuit breaker is calculated between two points on the travel curve as defined by the speed calculation zone. The speed calculation zone is part of the circuit breaker type specific default settings and matches the points used for off-line timing. The total travel of the movable contact refers to the distance traveled from minimum to maximum position, so it includes over travel of the movable contact. The timing of the opening/closing refers to the time calculated between the two points on the travel curve as defined by the speed calculation zone. The travel of the movable contact refers to the distance from where the movable starts to move until it reaches a position where the arcing contacts meet per design. This position is referred to as the "travel" and is measured from the fully closed position. The operation cycle covers a period when the circuit breaker starts from closing to opening or vice versa.

It can be observed that there exists a first dissimilarity between the normal travel curve 30 and the defective travel curve 31 in terms of each of the operating conditions. This holds true for closing operation, as well. The skilled person should understand that such dissimilarity can be used as indicator for the defect occurring in the circuit breaker.

Figure 4A:
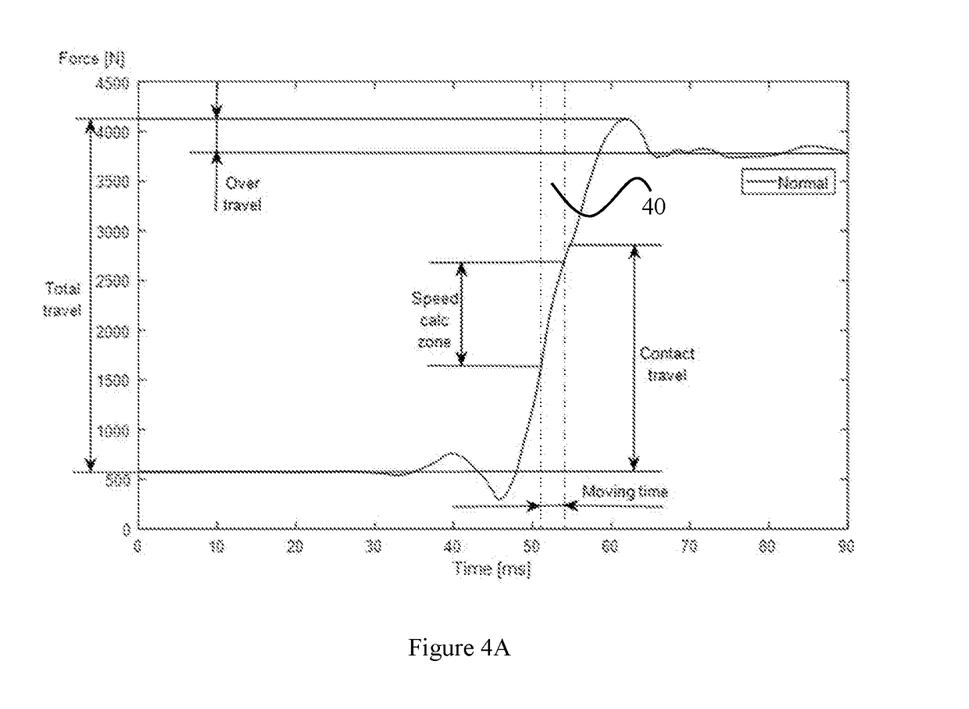
FIG. 4A and FIG. 4B are graphs of an exemplary traces of low-frequency components of the force applied to the fixed point of the element of the actuating mechanism of the circuit breaker respectively in normal condition and defective condition for an opening operation.
Figure 4B:
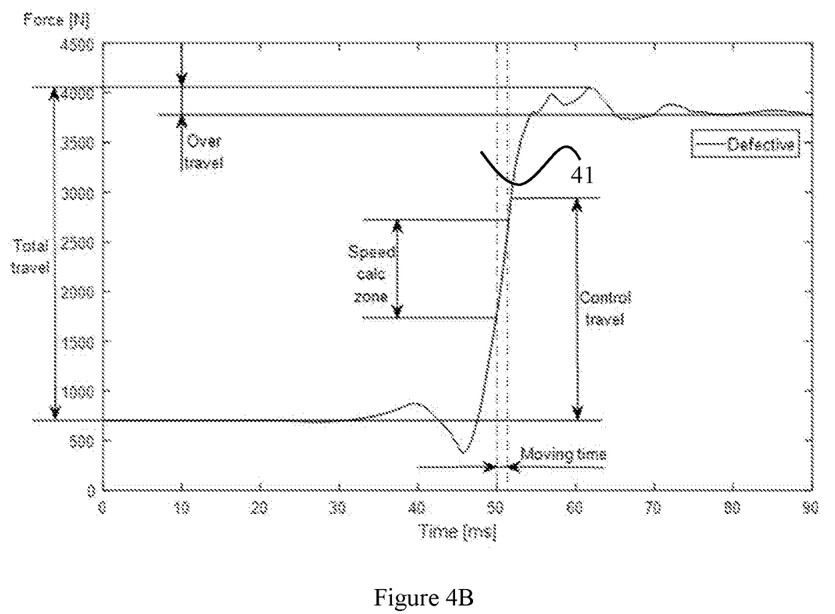
Figure 4C:
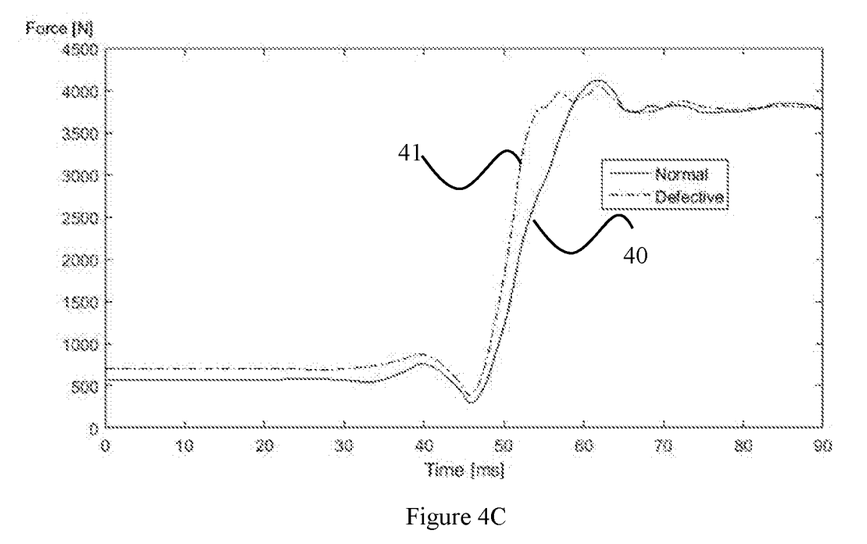
FIG. 4C illustrates a comparison of the exemplary traces from FIG. 4A and FIG. 4B.

FIG. 4A and FIG. 4B are graphs of an exemplary traces of low-frequency components of the force applied to the fixed point of the element of the actuating mechanism of the circuit breaker respectively in normal condition and defective condition for an opening operation. FIG. 4C illustrates a comparison of the exemplary traces from FIG. 4A and FIG. 4B. The graphs of FIG. 4A, FIG. 4B and FIG. 4C include an x-axis indicative of time and a y-axis illustrating the force at each corresponding unit of time, and the force curve 40 presents the normal operation and the force curve 41 presents the defective operation. When comparing the travel curve 30 of FIG. 3A and the force curve 40 of FIG. 4A, it can be observed they resemble each other. When comparing the travel curve 31 of FIG. 3B and the force curve 41 of FIG. 4B, it can be observed they resemble each other, as well. In particular, in either of the force curves 40, 41 of FIG. 4A and FIG. 4B, its operating condition related parameters may be observed and calculated, which correspond to and reflect the operating conditions concerning the respective one of the travel curves 30, 31 of FIG. 3A and FIG. 3B. Therefore, the first dissimilarity involving the travel curves 30, 31 of FIG. 3A and FIG. 3B may find its counterpart (a second dissimilarity) involving the force curves 40, 41 of FIG. 4A and FIG. 4B. In other words, it is possible to derive the first dissimilarity by calculating and monitoring the second dissimilarity, which in turn may be used to indicate the defect occurring in the circuit breaker.

Figure 5:
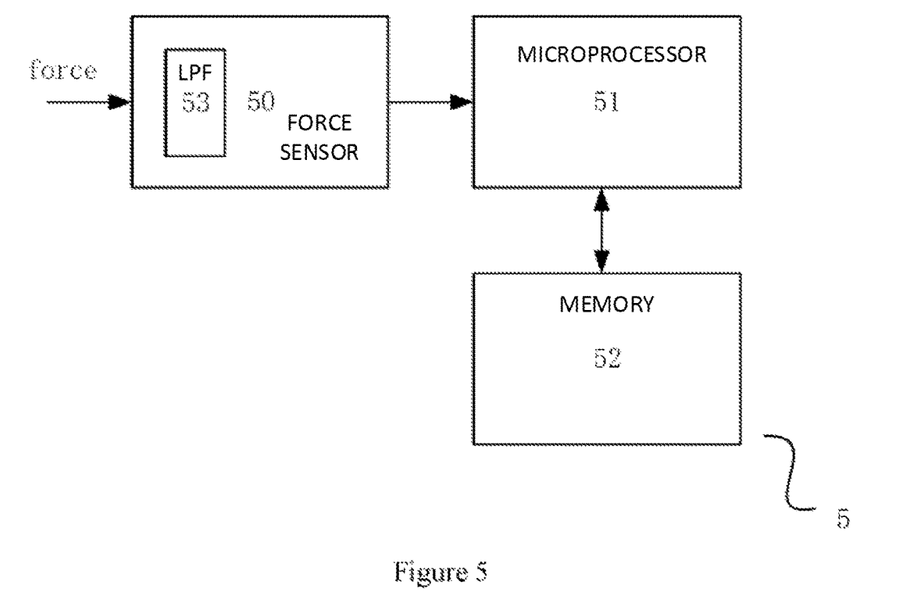
FIG. 5 is a schematic illustration of an apparatus for monitoring a circuit breaker of FIG. 1 according to an embodiment of present invention.

FIG. 5 is a schematic illustration of an apparatus for monitoring a circuit breaker of FIG. 1 according to an embodiment of present invention. As an example, the element 23 of the actuating mechanism 2, and the actuating mechanism 2 may be a linkage mechanism 21, 22, 23 having the fixed point 25 as one of its fulcrums, and its third level 23 is pivotally engaged with the fixed point 25. The force applied between the third level 23 and the fixed point 25 will be used for monitoring the condition of the circuit breaker. As an alternative, the element may be of the spring. The apparatus 5 includes a force sensor 50, a microprocessor 51 and a memory 52. An internet of things may include the circuit breaker, the apparatus for monitoring the circuit breaker according to any embodiments of present invention, and a server having the microprocessor of the apparatus for monitoring the circuit breaker.

Figure 6:
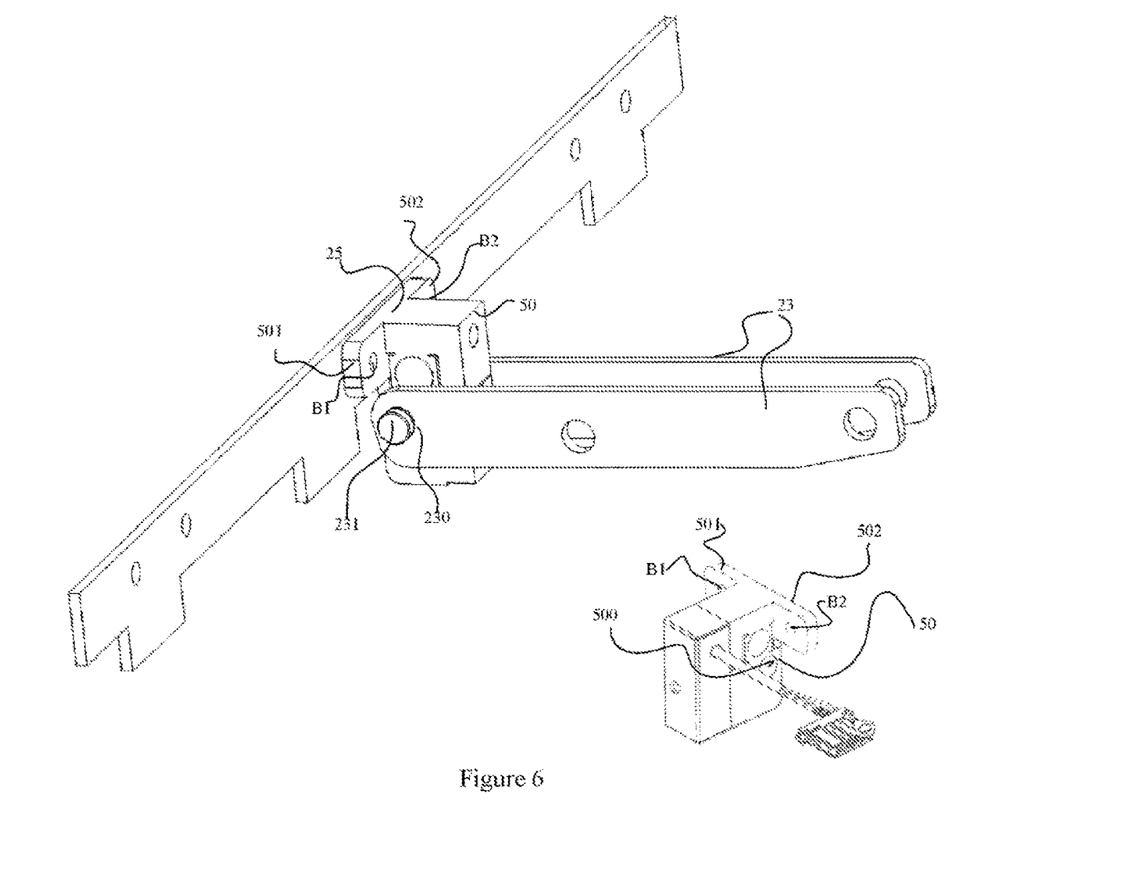
FIG. 6 shows a mechanical arrangement of the force sensor and the actuating mechanism according to an embodiment of present invention.

FIG. 6 shows a mechanical arrangement of the force sensor and the actuating mechanism according to an embodiment of present invention. The force sensor 50 may be configured to measure a force applied to the fixed point 25 of the element 21, 22, 23 of the actuating mechanism 2 of the circuit breaker in present operation cycle and generate a first data set representing the measurement of the force F1 in the present operation cycle. The force F1 may be divided into two components, including the horizontal component $F_{1x}$ and the vertical component $F_{1y}$. In this embodiment, for example, the force sensor 50 may be shaped like a rectangular cuboid. The force sensor 50 includes a pair of ears 501, 502 extending from one of the two faces. The ears 501, 502 each has a fastening means $B_1$, $B_2$ for fixing the force sensor 50 to a frame of the vacuum circuit breaker as shown in FIG. 1 such that the force sensor 50 may be secured relatively stable with respect to the stationary contact of the circuit breaker. The fastening means $B_1$, $B_2$, for example, may be a bolted joint for assembly of the ears 501, 502 of the force sensor 50 and the frame of the vacuum circuit breaker. Because any relative movement between the two can be avoided due to the fastening means $B_1$, $B_2$, the body of the force sensor 50 may be used as the fixed point 25 (the fulcrum) of the linkage mechanism 21, 22, 23. The force sensor 50 has a hole 500 formed through two of its faces. The internal surface of the hole 500 may be formed with material whose characteristics changes when a force or pressure is applied, for example the so-called "force-sensitive resistor". They are normally supplied as a polymer sheet or ink that can be applied by screen printing. The element 23 (the third lever) of the actuating mechanism 2 may have a hole 230 at one of its ends, and be pivotally coupled with the force sensor 50 (behaving as the fulcrum) via a pin 231 arranged through both of the hole 230 of the element 23 and the hole 50 of the force sensor 50. During an operation of opening/closing of the vacuum circuit breaker, due to the pivotal engagement, the force exerted by the third lever 23 to the force-sensitive part of the force sensor 50 (the internal surface of the hole 500) may be measured, giving the force curves as exemplified in FIG. 4A and FIG. 4B.

Figure 7:
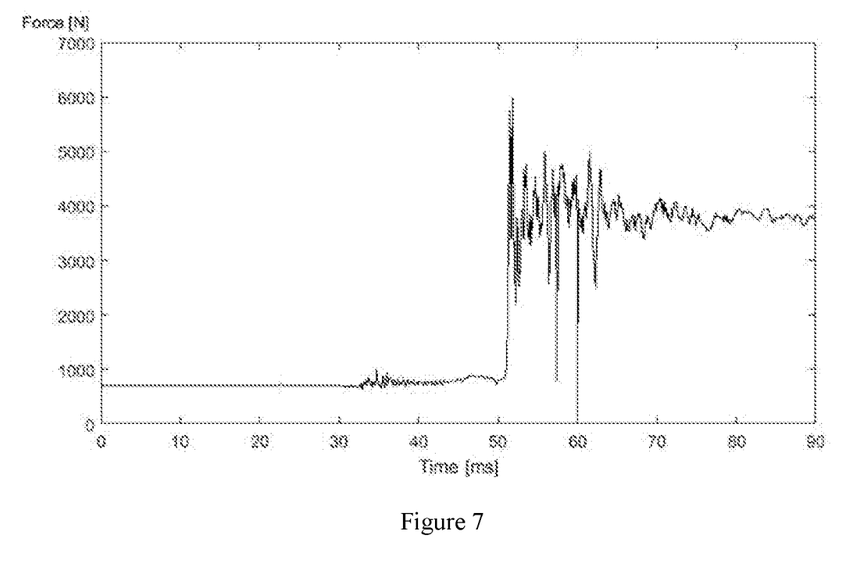
FIG. 7 is a graph of an exemplary traces of the force applied to the fixed point of the element of the actuating mechanism of the circuit breaker respectively in normal condition and defective condition for an opening operation.

FIG. 7 is a graph of an exemplary traces of the force applied to the fixed point of the element of the actuating mechanism of the circuit breaker respectively in normal condition and defective condition for an opening operation. For example during the opening operation, the measurements of the force F1 is transmitted to an input of a low-pass filter 53 of the microprocessor 51. The low-pass filter 53 envelopes the measurements of the force F1 to facilitate reducing high frequency noise and facilitate reducing unwanted non-peak related signal information. The output of the low-pass filter 53 may be represented by the graphs as shown in FIG. 4A and FIG. 4B in normal condition and defective condition for the opening operation. The output of the low-pass filter 53 is transmitted to a digital input of microprocessor 51 as the operating condition related parameters of the element in the closing operation.

As mentioned above, by monitoring the second dissimilarity involving the force curves 40, 41 of FIG. 4A and FIG. 4B respectively representing the normal condition and defective condition of the circuit breaker, the operation condition of the circuit breaker may be determined. Based on this principle, the microprocessor 51 may be configured to judge a health condition of the circuit breaker in consideration of normal operating condition related parameters of the element according to a history profile when the circuit breaker operated normally and current operating condition related parameters of the element in the present operation cycle extracted from the force represented by the first data set.

For example, the history profile may be stored in the memory 52. The microprocessor 51 may be further configured to obtain a second data set representing force applied to the fixed point in a plurality of operation cycles from the history profile and extract operating condition related parameters for each of the operation cycles from the force represented by the second data set. In this embodiment, an offline normal data set {C_1, C_2,n . . . , C_n} of the target circuit breaker may be stored in the memory 52 (the second data set), while C_i (i=1, 2, . . . , n) each represents the force curve measured by the force sensor 50 in a respective one of the n normal operation cycles. From the low-frequency components of the n force curves, by applying finger print creation method, the operating condition related parameters of the element 23 of the actuating mechanism 2 may be observed and calculated. In order to get the low-frequency components, the extraction of the operating condition related parameters may be adapted to low-frequency extraction, for example, by a low-pass filter. Such operating condition related parameter being extracted from the second data set, for example, concern with at least one of: opening/closing speed of a movable contact of the circuit breaker, total travel of the movable contact, timing of the opening/closing, travel of the movable contact, and over travel of the movable contact. Therefore, each component of the second data set C_i can be transferred to X_i including at least of the operating condition related parameter. Also, the offline normal dataset {C_1, C_2, . . . , C_n} becomes {X_1, X_2, . . . , X_n}.

The microprocessor 51 may be further configured to divide the second data set {C_1, C_2,n . . . , C_n} into two groups respectively corresponding to a first number and a second number of the plurality of operation cycles from the history profile. In this embodiment, for example, the offline normal second data set is evenly split into two parts, and the operating condition related parameters may be divided into D and D* accordingly, while D includes features of some normal samples in the first number, and D* includes features of the rest of the samples in the second number. D is considered as a benchmark matrix for residual calculation, and D* will be used for threshold determination.

$$D=\{X_1, X_2, \ldots, X_m\} \quad (1)$$

$$D_*\{X_{m+1}, X_{m+2}, \ldots, X_n\} \quad (2)$$

wherein: the first number counts from 1 to m, and the second number counts from m+1 to n.

In terms of the operating condition related parameter D and D*, the microprocessor 51 may be configured to identify historical dissimilarity involving the respective one of the second number of the operation cycles and the first number of the operation cycles. In this embodiment, for example, the historical dissimilarity of each measured data $X_t$ can be calculated:

$$R_t = \text{mean}(D^T \otimes X_t) \quad (3)$$

$$D^T \otimes X_t = \begin{bmatrix} X_1^T \otimes X_t \\ \vdots \\ X_m^T \otimes X_t \end{bmatrix} \quad (4)$$

$$X \otimes Y = \sqrt{\sum_{i=1}^{t}(x_i - y_i)^2} \quad (5)$$

where $S_t$ is the calculated dissimilarity.

In terms of the operating condition related parameter, the microprocessor 51 may be further configured to identify current dissimilarity, which is the dissimilarity of timely monitored data to historical normal data, involving the current operation cycle and the first number of the operation cycles. In this embodiment, for example, the microprocessor 51 may calculate the historical dissimilarity set $R_{train} = [R_{m+1}, R_{m+2}, \ldots, R_n]$ of all the feature vectors in $D_*$, according to equation (3). Threshold value is determined as, $$\text{Thre}=N \cdot \max(R_{train}) \quad (6)$$

where N is recommended to be 3~4.

The microprocessor 51 may be configured to give the judgement of the health condition of the circuit breaker based on a comparison of the historical dissimilarity and the current dissimilarity. In this embodiment, for example, the status determination is quite straight forward—for any measured data $X_t$, the corresponding status is abnormal if $R_t$>Thre, otherwise is normal.

During each operation cycle, the force measured at a fixed point of the actuating mechanism models the health condition of the circuit breaker, which varies from normal condition to defective condition of the actuating mechanism. By measuring and analysing the force during each operation cycle, a health condition of the actuating mechanism, which corresponds to a dissimilarity between current condition and historical healthy condition in terms of the operating condition related parameters, may be determined.

A technical effect of the circuit breaker monitoring apparatus and methods described herein featured in terms of high accuracy because of using force sensor and proper time-frequency analysis method, high intelligence due to automatic model developing based on data-driven solutions.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. An apparatus for monitoring a circuit breaker, comprising:
   a force sensor comprising:
      a first face, and
      a second face,
      wherein the force sensor is attached to a stationary contact of the circuit breaker and is configured to measure a force applied to a fixed point of the force sensor by an element of a linkage mechanism in an actuating mechanism of the circuit breaker in a present operation cycle and generate a first data set representing signals corresponding to a measurement of the force in the present operation cycle;
   a microprocessor,
      wherein the microprocessor is configured to judge a health condition of the circuit breaker in consideration of normal operating condition related parameters of the element according to a history profile when the circuit breaker operated normally and current operating condition related parameters of the element in the present operation cycle extracted from the force represented by the first data set, and wherein the microprocessor is configured to generate a signal indicating the health condition of the actuating mechanism of the circuit breaker; and
   a pin,
      wherein the pin defines the fixed point, the pin being arranged through the force sensor through a hole defined at each of the first face and the second face, and through a hole defined at an end of the element of the linkage mechanism, wherein the pin pivotably couples the force sensor to the element of the linkage mechanism at the fixed point and forms a fulcrum; and wherein the force sensor is electrically communicable with the microprocessor;

wherein the microprocessor is configured to extract a horizontal and a vertical component of the force measurement from the signals corresponding to the first data set, and extract a current operating condition related parameters of the element of the linkage mechanism of the circuit breaker based on the first data set.

2. The apparatus according to claim 1, wherein:
the operating condition related parameters of the element of the linkage mechanism comprises at least one of: opening/closing speed of a movable contact of the circuit breaker, total travel of the movable contact, timing of the opening/closing, travel of the movable contact, and over travel of the movable contact.

3. The apparatus according to claim 1, wherein:
the microprocessor is further configured to obtain a second data set representing force applied to the fixed point in a plurality of operation cycles from the history profile and extract operating condition related parameters for each of the operation cycles from the force represented by the second data set.

4. The apparatus according to claim 3, wherein the microprocessor is further configured to:
divide the second data set into two groups respectively corresponding to a first number and a second number of the plurality of operation cycles from the history profile;
in terms of the operating condition related parameter, identify historical dissimilarity involving the respective one of the second number of the operation cycles and the first number of the operation cycles;
in terms of the operating condition related parameter, identify current dissimilarity involving the current operation cycle and the first number of the operation cycles; and
wherein the judging of the health condition of the circuit breaker is based on a comparison of the historical dissimilarity and the current dissimilarity.

5. The apparatus according to claim 1, wherein:
the extraction of the current operating condition related parameters is adapted to low-frequency extraction.

6. The apparatus according to claim 1, wherein:
the present operation cycle covers a period when the circuit breaker starts from closing to opening or vice versa.

7. The apparatus according to claim 1, wherein:
the element is of a spring.

8. A system, comprising:
a circuit breaker comprising:
a force sensor, attached to a stationary contact of the circuit breaker and being configured to measure a force applied to a fixed point by an element of a linkage mechanism in an actuating mechanism of the circuit breaker in present operation cycle and generate a first data set representing the measurement of the force in the present operation cycle, the force sensor comprising:
a first face,
a second face, and
at least one ear extending from one of the first face and the second face,
wherein a fastener fixes the at least one ear of the force sensor to the stationary contact; and
a pin, defining the fixed point,
wherein the pin is arranged through the force sensor through a hole defined at each of the first face and the second face, and through a hole defined at an end of the element of the linkage mechanism at the fixed point and forming a fulcrum;
a server, the server including:
a microprocessor, being configured to receive the first data set from the circuit breaker and judge a health condition of the circuit breaker in consideration of normal operating condition related parameters of the element of the linkage mechanism according to a history profile when the circuit breaker operated normally and current operating condition related parameters of the element of the linkage mechanism in the present operation cycle extracted from the force represented by the first data set, and being configured to generate a signal indicating the health condition of the actuating mechanism of the circuit breaker,
wherein the microprocessor monitors the circuit breaker; and
wherein the force sensor is electrically communicable with the microprocessor;
wherein the microprocessor is configured to extract a horizontal and a vertical component of the force measurement from the signals corresponding to the first data set, and extract a current operating condition related parameters of the element of the linkage mechanism of the circuit breaker based on the first data set.

9. The system of claim 8, wherein:
the microprocessor is further configured to obtain a second data set representing force applied to the fixed point in a plurality of operation cycles from the history profile and extract operating condition related parameters for each of the operation cycles from the force represented by the second data set.

10. The system of claim 8, wherein the circuit breaker further comprises:
a low-pass filter,
wherein the low-pass filter is configured to receive the measurements of the force from the force sensor and reduces high frequency noise and non-peak related signal information,
wherein the extraction of the current operating condition related parameters is adapted to low-frequency extraction.

11. The system of claim 8, wherein:
the operating condition related parameters of the element of the linkage mechanism comprises at least one of: opening/closing speed of a movable contact of the circuit breaker, total travel of the movable contact, timing of the opening/closing, travel of the movable contact, and over travel of the movable contact.

* * * * *